(12) United States Patent
Shirato et al.

(10) Patent No.: US 12,225,695 B2
(45) Date of Patent: Feb. 11, 2025

(54) ELECTRICAL DEVICE

(71) Applicant: Panasonic Intellectual Property Management Co., Ltd., Osaka (JP)

(72) Inventors: Youji Shirato, Hokkaido (JP); Naoki Saitou, Hokkaido (JP); Norihiro Kawamura, Hokkaido (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 175 days.

(21) Appl. No.: 18/098,989

(22) Filed: Jan. 19, 2023

(65) Prior Publication Data

US 2023/0247806 A1 Aug. 3, 2023

(30) Foreign Application Priority Data

Jan. 31, 2022 (JP) .................. 2022-013568

(51) Int. Cl.
*H05K 7/20* (2006.01)
*H05K 1/02* (2006.01)

(52) U.S. Cl.
CPC .......... *H05K 7/209* (2013.01); *H05K 1/0203* (2013.01); *H05K 7/2039* (2013.01)

(58) Field of Classification Search
CPC ............... H01L 23/3735; H01L 23/373; H01L 23/3672; H01L 25/072; H01L 23/36; H01L 23/3677; H01L 23/49833; H01L 2023/4043; H01L 2023/4056; H01L 21/4882; H01L 2224/32145; H01L 23/4006; H01L 23/40; H01L 23/4093; H01L 23/49822; G06F 1/20; G06F 1/206; G06F 2200/201; H05K 1/0203; H05K 7/20254; H05K 1/181; H05K 7/2039; H05K 7/20509; H05K 7/209; H05K 1/0204; H05K 1/111; H05K 1/184; H05K 2201/0391; H05K 3/0061; H05K 7/20;
(Continued)

(56) References Cited

U.S. PATENT DOCUMENTS 8,564,957 B2 * 10/2013 Usui ................. H05K 7/20509
361/720
9,980,415 B2 * 5/2018 Zhou ................. H05K 7/20927
(Continued)

FOREIGN PATENT DOCUMENTS

JP 2001-156225 A 6/2001

*Primary Examiner* — Michael A Matey
(74) *Attorney, Agent, or Firm* — Rimon P.C.

(57) ABSTRACT

An electrical device according to the present disclosure includes a heat generator, a heat dissipator, a thermal conductive sheet, and a thermal conductive fluid. The heat generator has a first surface. The heat dissipator has a second surface that faces the first surface. The thermal conductive sheet and the thermal conductive fluid are both interposed between the first surface and the second surface. The first surface and the second surface face each other in their respective counter regions. Each of the counter regions includes a first region and a second region when viewed in a direction in which the first and second surfaces face each other. The first region holds the thermal conductive fluid but does not receive the thermal conductive sheet. The second region is adjacent to the first region and receives the thermal conductive sheet.

3 Claims, 9 Drawing Sheets

(58) Field of Classification Search
CPC ... H05K 2201/066; H05K 2201/10416; H05K 3/341; H05K 7/20472; H05K 7/20963; B23P 2700/10; F28D 1/03; F28D 2021/0029; F28F 2013/006
See application file for complete search history.

(56) References Cited

U.S. PATENT DOCUMENTS

| | | | |
|---|---|---|---|
| 10,561,040 B1* | 2/2020 | Lunsman | H05K 7/20272 |
| 11,981,136 B2* | 5/2024 | Kanegae | B41J 2/15 |
| 2005/0205989 A1* | 9/2005 | Shibuya | H01L 23/3735 |
| | | | 257/E23.106 |
| 2012/0113598 A1* | 5/2012 | Toh | H01L 23/473 |
| | | | 361/715 |
| 2016/0242312 A1* | 8/2016 | Singh | H01L 23/473 |
| 2018/0374716 A1* | 12/2018 | Stathakis | H01L 21/56 |
| 2019/0394898 A1* | 12/2019 | Manninen | H05K 7/209 |
| 2020/0279791 A1* | 9/2020 | Finarelli | H01L 25/18 |
| 2021/0035886 A1* | 2/2021 | Islam | H01L 25/16 |
| 2021/0274690 A1* | 9/2021 | Cho | H02M 1/327 |
| 2021/0305119 A1* | 9/2021 | Mallik | H01L 23/5385 |
| 2021/0375716 A1* | 12/2021 | Tadayon | H01L 23/3733 |
| 2023/0269914 A1* | 8/2023 | Yoshihara | G11C 5/04 |
| | | | 361/712 |
| 2023/0352365 A1* | 11/2023 | Shirato | H01L 23/3735 |
| 2024/0032261 A1* | 1/2024 | Lyu | H05K 1/181 |

* cited by examiner

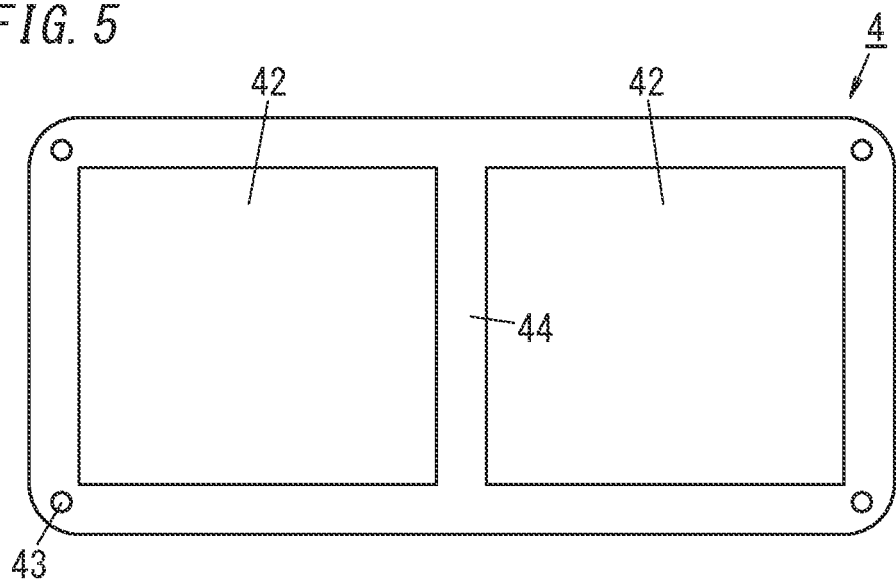

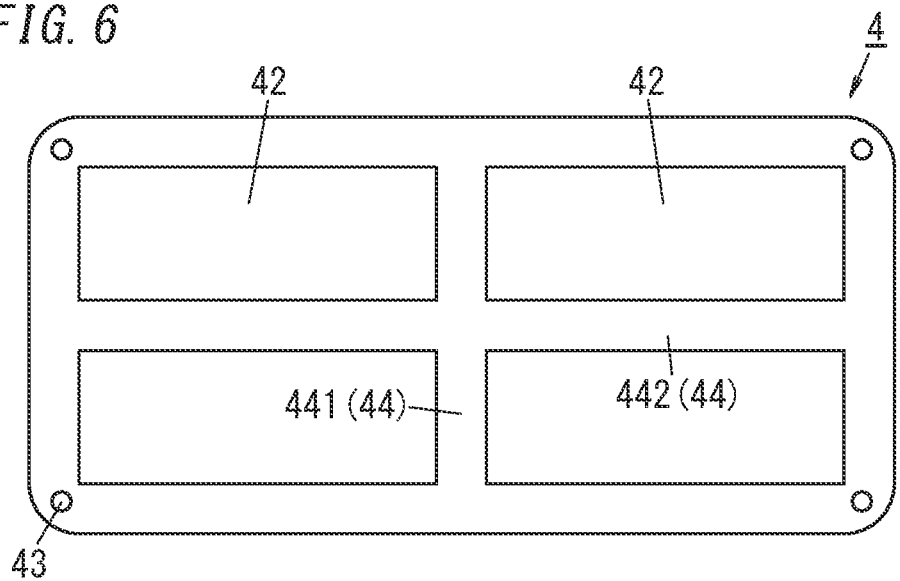

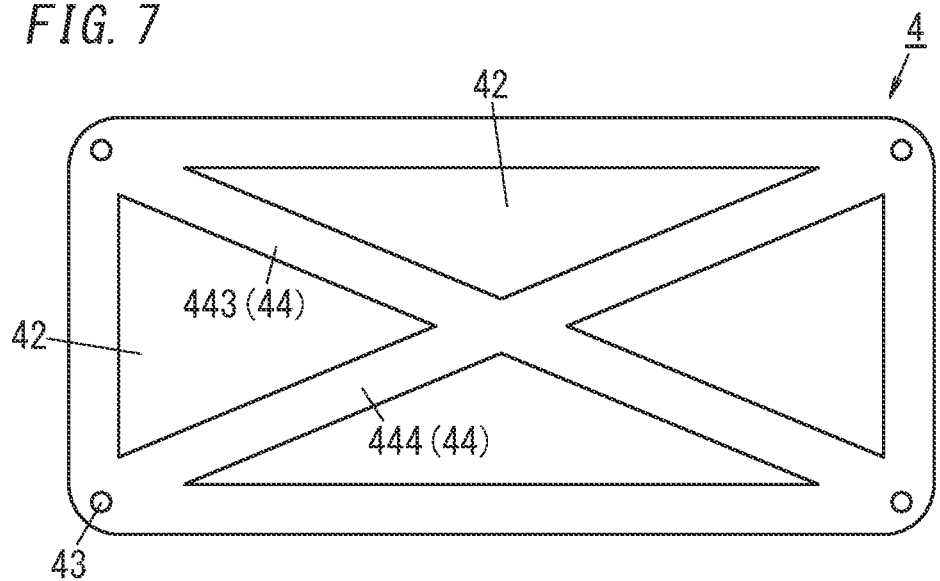

ELECTRICAL DEVICE

CROSS-REFERENCE TO RELATED APPLICATIONS

The present application is based upon, and claims the benefit of priority to, Japanese Patent Application No. 2022-013568, filed on Jan. 31, 2022, the entire contents of which are hereby incorporated by reference.

TECHNICAL FIELD

The present disclosure generally relates to an electrical device and more particularly relates to an electrical device including a heat generator, a heat dissipator, and a member having thermal conductivity and interposed between the heat generator and the heat dissipator.

BACKGROUND ART

JP 2001-156225 A discloses a semiconductor device with improved heat dissipation ability and electrical conductivity. JP 2001-156225 A teaches that a thermally conductive grease may be applied to each of respective contact surfaces of an insulating substrate with high thermal conductivity and an external cooling member.

However, simply interposing the grease between a heat generator and a heat dissipator makes it more and more likely for the grease to flow out with the passage of time, thus increasing the chances of causing a decline in the performance of heat conduction between the heat generator and the heat dissipator.

SUMMARY

The present disclosure provides an electrical device that reduces the chances of causing a decline in the performance of heat conduction between the heat generator and the heat dissipator.

An electrical device according to an aspect of the present disclosure includes a heat generator, a heat dissipator, a thermal conductive sheet, and a thermal conductive fluid. The heat generator has a first surface. The heat dissipator has a second surface that faces the first surface. The thermal conductive sheet and the thermal conductive fluid are both interposed between the first surface and the second surface. The first surface and the second surface face each other in their respective counter regions. Each of the counter regions includes a first region and a second region when viewed in a direction in which the first and second surfaces face each other. The first region holds the thermal conductive fluid but does not receive the thermal conductive sheet. The second region is adjacent to the first region and receives the thermal conductive sheet.

BRIEF DESCRIPTION OF DRAWINGS

The figures depict one or more implementations in accordance with the present teaching, by way of example only, not by way of limitations. In the figures, like reference numerals refer to the same or similar elements.

FIG. 5 is a top view of a thermal conductive sheet according to a second embodiment as viewed in the thickness direction;

FIG. 6 is a top view of a thermal conductive sheet according to a third embodiment as viewed in the thickness direction;

FIG. 7 is a top view of a thermal conductive sheet according to a fourth embodiment as viewed in the thickness direction;

DETAILED DESCRIPTION

Overview

An electrical device according to the present disclosure will be described. Note that the embodiment to be described below is only an exemplary one of various embodiments of the present disclosure and should not be construed as limiting. Rather, the exemplary embodiment may be readily modified in various manners depending on a design choice or any other factor without departing from the scope of the present disclosure. The drawings to be referred to in the following description of embodiments are all schematic representations. Thus, the ratio of the dimensions (including thicknesses) of respective constituent elements illustrated on the drawings does not always reflect their actual dimensional ratio.

Figure 1:
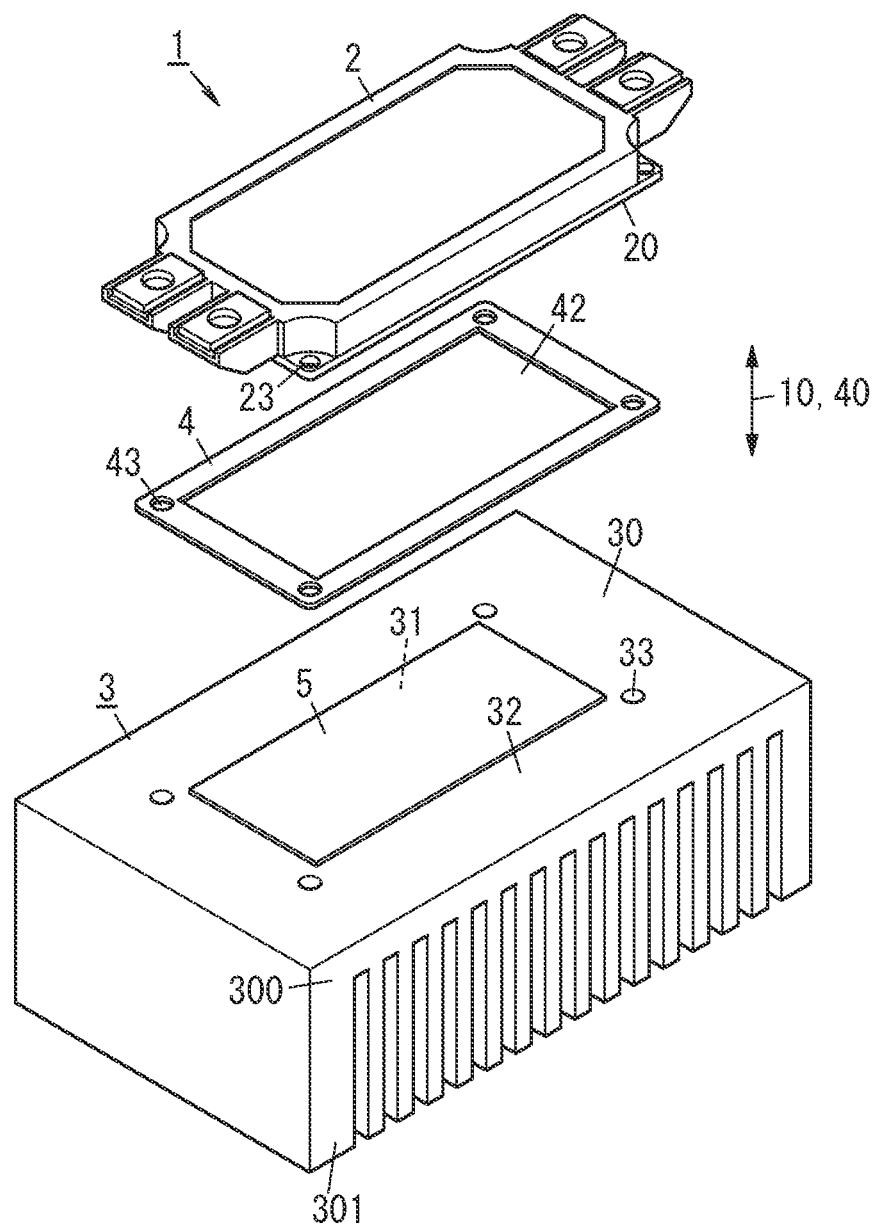
FIG. 1 is an exploded perspective view of an electrical device according to a first embodiment of the present disclosure.

As shown in FIG. 1, an electrical device 1 according to the present disclosure includes a heat generator, a heat dissipator, a thermal conductive sheet, and a thermal conductive fluid. The heat generator has a first surface. The heat dissipator has a second surface that faces the first surface. The thermal conductive sheet and the thermal conductive fluid are both interposed between the first surface and the second surface. The first surface and the second surface face each other in their respective counter regions. Each of the counter regions includes a first region and a second region when viewed in a direction in which the first and second surfaces face each other. The first region holds the thermal conductive fluid but does not receive the thermal conductive sheet. The second region is adjacent to the first region and receives the thermal conductive sheet.

This electrical device reduces the chances of causing a decline in the performance of heat conduction between the heat generator and the heat dissipator.

First Embodiment

Next, an electrical device 1 according to a first embodiment will be described with reference to FIGS. 1-4B.

Overview of Electrical Device

As shown in FIG. 1, the electrical device 1 includes a heat generator 2, a heat dissipator 3, a thermal conductive sheet 4, and a thermal conductive fluid 5. The electrical device 1 according to the first embodiment is a circuit component for use in a power converter unit. The power converter unit converts input power into a predetermined type of output power and delivers the output power. Specifically, the power converter unit is a power conditioner having the function of converting DC power into AC power and the function of converting AC power into DC power. Note that the power converter unit may be a DC/DC converter or an AC/AC converter as well.

Heat Generator

The heat generator 2 is a component that generates heat and may be, for example, a power module such as a semiconductor switching element. The power module is a constituent element of the power converter unit. The power module includes a board, a conductor, and a mounted component. The board may be, for example, a rigid board such as a glass epoxy board or a silicon board. The conductor may be a sheet of metal foil such as a sheet of copper foil and forms a wiring pattern on the board. The conductor is formed on at least one of the two surfaces of the board. The mounted component that generates heat is mounted on the board. Heat is generated from the heat generator 2 as a whole.

Alternatively, the heat generator 2 may also be a reactor or a transformer. The reactor or transformer is a constituent element of the power converter unit. The reactor may be, for example, a DC reactor, an AC reactor, or a reactor of a filter circuit.

The heat generator 2 has, as one of all surfaces thereof, a surface through which heat is dissipated toward the heat dissipator 3 via the thermal conductive sheet 4 and the thermal conductive fluid 5. This surface will be hereinafter referred to as a "first surface 20" for convenience sake. The first surface 20 has a part facing the second surface 30 (to be described later) of the heat dissipator 3 via the thermal conductive sheet 4 and the thermal conductive fluid 5. That part of the first surface 20 is herein defined to be a "counter region." The first surface 20 (including the counter region) of the heat generator 2 according to the first embodiment is mostly a flat surface. Note that the first surface 20 of the heat generator 2 may or may not be an entirely flat surface, whichever is appropriate. In the latter case, part of the first surface 20 may be a curved portion, a raised portion, a recess, a hole, or a portion with microscopic unevenness.

Figure 2A:
FIG. 2A is a front view of a first surface of a heat generator included in the electrical device.

The heat dissipator 3 is not directly in contact with the heat generator 2. Instead, the thermal conductive sheet 4 and the thermal conductive fluid 5 are directly in contact with the heat generator 2. The thermal conductive sheet 4 and the thermal conductive fluid 5 are in contact with the counter region of the first surface 20 of the heat generator 2. As shown in FIG. 2A, a part of the counter region of the first surface 20 of the heat generator 2 is in contact with the thermal conductive fluid 5 but out of contact with the thermal conductive sheet 4. Such a part is herein defined to be a "first region 21." On the other hand, the other part of the counter region of the first surface 20 of the heat generator 2 is in contact with the thermal conductive sheet 4. Such a part is herein defined to be a "second region 22." The space between the first region 21 of the heat generator 2 and a first region 31 of the heat dissipator 3 is occupied by the thermal conductive fluid 5 (to be described later). The space between the second region 22 of the heat generator 2 and a second region 32 of the heat dissipator 3 is occupied by the thermal conductive sheet 4 (to be described later) (refer to FIG. 3).

Heat Dissipator

As shown in FIG. 1, heat is transferred from the heat generator 2 to the heat dissipator 3 via the thermal conductive sheet 4 and the thermal conductive fluid 5. The heat dissipator 3 according to the first embodiment includes: a plate-shaped base portion 300; and a plurality of fins 301 formed to protrude from one of the two surfaces of the base portion 300 (which intersect at right angles with the thickness direction defined for the base portion 300 and which are located opposite from each other, out of all surfaces of the base portion 300). The heat dissipator 3 may be made appropriately of a metal such as aluminum, copper, or iron or an alloy such as SUS or brass.

One of the surfaces of the heat dissipator 3 is a surface to which the heat is transferred from the heat generator 2. Such a surface will be hereinafter referred to as a "second surface 30" for convenience sake. In the first embodiment, the second surface 30 of the base portion 300 is a surface without the fins 301. At least a part of the second surface 30 of the heat dissipator 3 faces at least a part of the first surface 20 of the heat generator 2 via the thermal conductive sheet 4 and the thermal conductive fluid 5. As in the counter region of the first surface 20 of the heat generator 2, part of the second surface 30 faces the first surface 20 of the heat generator 2 via the thermal conductive sheet 4 and the thermal conductive fluid 5 and such a part will be hereinafter also referred to as a "counter region."

The second surface 30 of the heat dissipator 3 according to the first embodiment (including the counter region thereof) is mostly a flat surface. Note that the second surface 30 of the heat dissipator 3 may or may not be an entirely flat surface, whichever is appropriate. In the latter case, a part of the second surface 30 may be a curved portion, a raised portion, a recess, a hole, or a portion with microscopic unevenness.

Figure 2B:
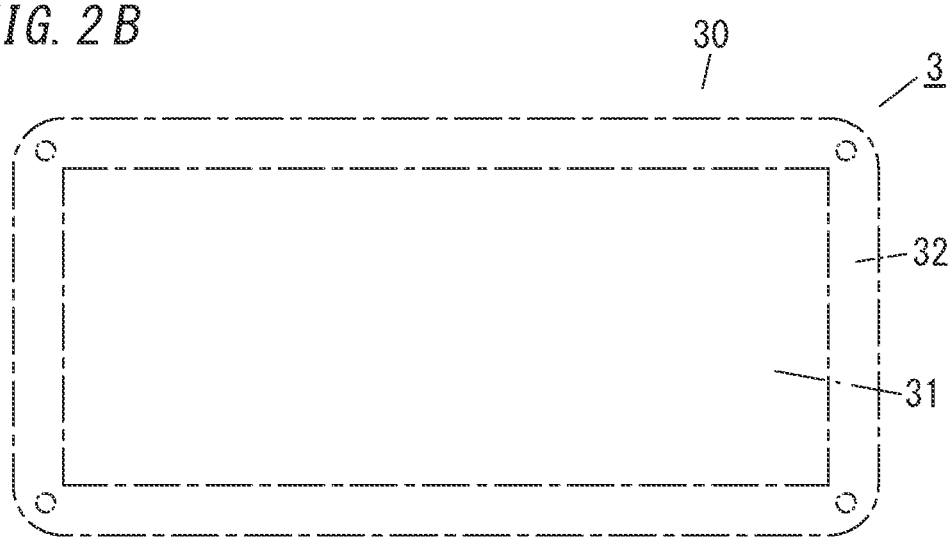
FIG. 2B is a front view of a second surface of a heat dissipator included in the electrical device.

The thermal conductive sheet 4 and the thermal conductive fluid 5 are in contact with the counter region of the second surface 30 of the heat dissipator 3. As shown in FIG. 2B, part of the counter region of the second surface 30 of the heat dissipator 3 is in contact with the thermal conductive fluid 5 but out of contact with the thermal conductive sheet 4. Such a part is herein defined to be a "first region 31." On the other hand, the other part of the counter region of the second surface 30 of the heat dissipator 3 is in contact with the thermal conductive sheet 4. Such a part is herein defined to be a "second region 32."

Figure 3:
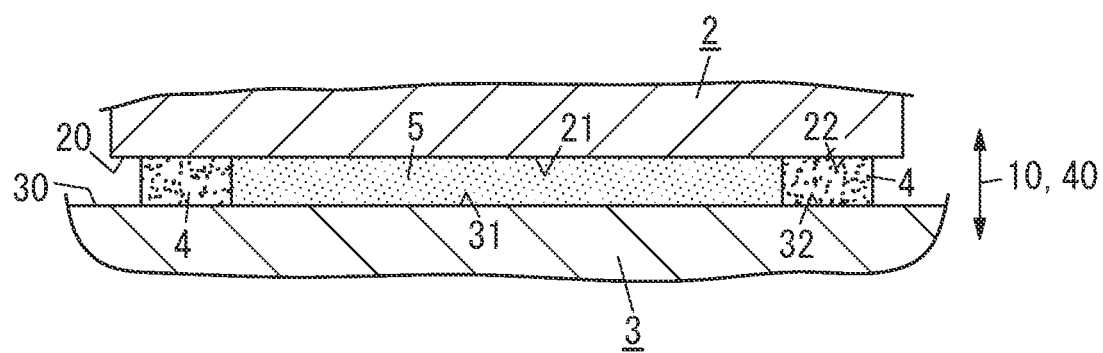
FIG. 3 is a cross-sectional view of a main part of the electrical device.

As shown in FIG. 3, the first region 31 of the heat dissipator 3 faces the first region 21 of the heat generator 2 but does not face the second region 22 of the heat generator 2. Also, the second region 32 of the heat dissipator 3 faces the second region 22 of the heat generator 2 but does not face the first region 21 of the heat generator 2. In other words, when viewed in the direction in which the first surface 20 of the heat generator 2 and the second surface 30 of the heat dissipator 3 face each other (hereinafter referred to as a "facing direction 10"), the first region 31 of the heat dissipator 3 is arranged to overlap with the first region 21 of the heat generator 2 but not to overlap with the second region 22 of the heat generator 2. The second region 32 of the heat dissipator 3 is arranged to overlap with the second region 22 of the heat generator 2 but not to overlap with the first region 21 of the heat generator 2.

Thermal Conductive Sheet

As shown in FIGS. 1 and 3, the thermal conductive sheet 4 is interposed between the first surface 20 of the heat generator 2 and the second surface 30 of the heat dissipator 3. More specifically, the thermal conductive sheet 4 is sandwiched between the second region 22 of the heat generator 2 and the second region 32 of the heat dissipator 3. The thermal conductive sheet 4 transfers heat from the first surface 20 of the heat generator 2 to the second surface 30 of the heat dissipator 3.

Also, the thermal conductive sheet 4 is arranged to reduce the chances of the thermal conductive fluid 5 (to be described later) flowing out of the space between the first region 21 and the first region 31. The second regions 22, 32 where the thermal conductive sheet 4 is received is adjacent to the first regions 21, 31 where the thermal conductive fluid 5 is held.

Figure 4A:
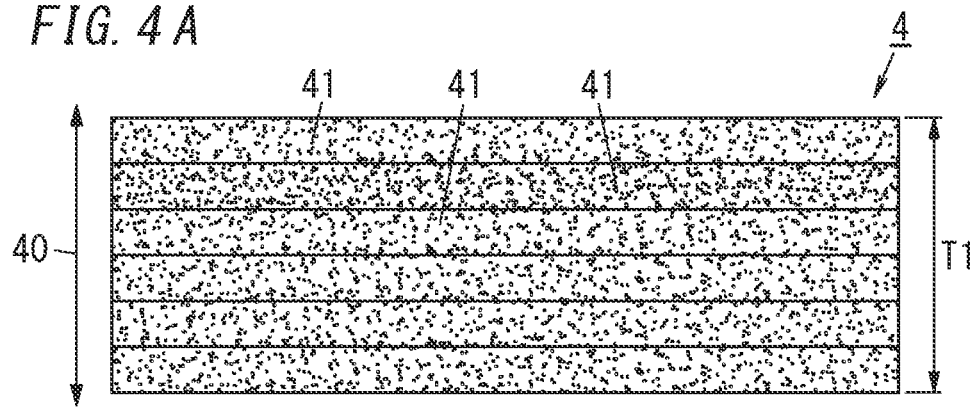
FIG. 4A is a partial cross-sectional view of a thermal conductive sheet included in the electrical device.

In the first embodiment, the thermal conductive sheet 4 is a graphite sheet formed by stacking a plurality of graphite layers 41 one on top of another in a thickness direction 40 as shown in FIG. 4A. An air gap is left between the graphite layers 41 when no pressure is applied to the thermal conductive sheet 4 in the thickness direction 40. Note that as the pressure applied to the thermal conductive sheet 4 in the thickness direction 40 increases, the air gap between the graphite layers 41 collapses and shrinks. In this graphite sheet, bubbles are exhausted through the air gaps between the plurality of graphite layers 41. This allows, when an excessive thermal conductive fluid 5 has been supplied, the excessive thermal conductive fluid 5 to be absorbed into the air gaps between the graphite layers 41 and held there, thus reducing the leakage of the thermal conductive fluid 5.

Figure 4B:
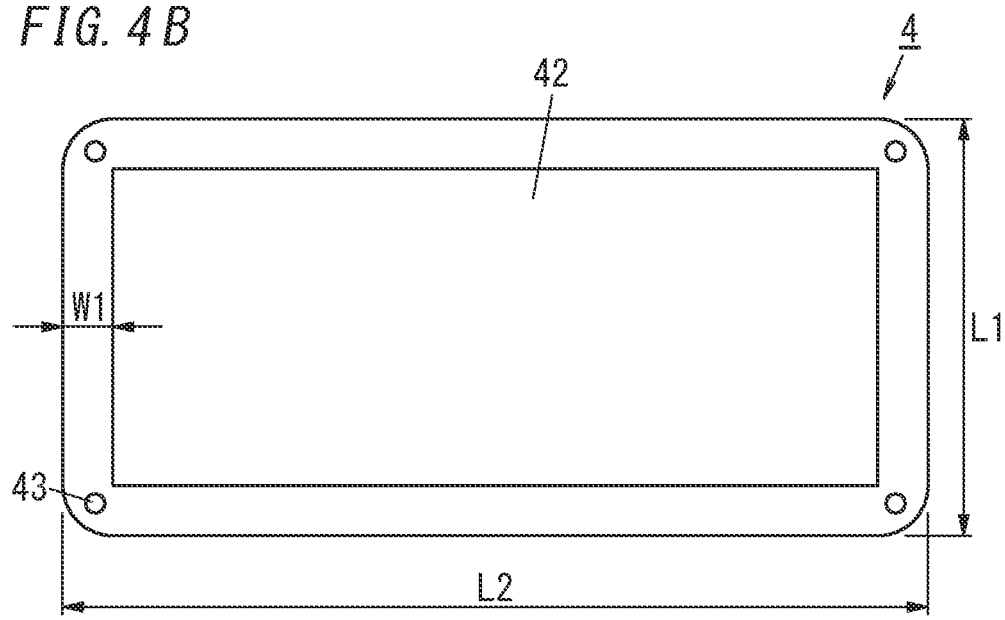
FIG. 4B is a top view of the thermal conductive sheet as viewed in a thickness direction.

If two surfaces of the thermal conductive sheet 4, which intersect at right angles with the thickness direction 40 defined for the thermal conductive sheet 4 and which are located opposite from each other, out of all surfaces of the thermal conductive sheet 4 are hereinafter referred to as "sheet surfaces," then one of the two sheet surfaces is in contact with the second region 22 of the heat generator 2 and the other sheet surface is in contact with the second region 32 of the heat dissipator 3 as shown in FIGS. 1 and 3. As shown in FIG. 4B, the thermal conductive sheet 4 is formed in the shape of a rectangular ring, of which the longitudinal dimension L1 is 60 mm and the lateral dimension L2 is 120 mm and which has a window 42 inside, when viewed in the thickness direction 40. Note that one of the two directions aligned with the sheet surfaces will be hereinafter referred to as a "longitudinal direction" and the other direction thereof that intersects with the longitudinal direction will be hereinafter referred to as a "lateral direction." Although the corners of the thermal conductive sheet 4 are rounded in the first embodiment when viewed in the thickness direction 40, the corners of the thermal conductive sheet 4 do not have to be rounded or chamfered.

Also, the width W1 of the thermal conductive sheet 4 (i.e., the distance between the outer peripheral edge and inner peripheral edge (that faces the window 42) of the thermal conductive sheet 4) is 5 mm.

As shown in FIGS. 2A and 2B, the respective shapes and dimensions of the second region 22 of the heat generator 2 and the second region 32 of the heat dissipator 3 as viewed in the facing direction 10 are the same as the shape and dimensions of the thermal conductive sheet 4 as viewed in the thickness direction 40 as shown in FIG. 4B. Thus, the dimension of the second regions 22, 32 of the thermal conductive sheet 4 interposed between the first surface 20 and the second surface 30 as measured in a direction pointing away from the first region 21, 31 herein refers to the width W1. In addition, the second regions 22, 32 are adjacent to the first regions 21, 31, respectively, along the entire circumference thereof.

As shown in FIG. 4A, according to the first embodiment, the thickness T1 of the thermal conductive sheet 4 to which no pressure is applied in the thickness direction 40 is 200 μm. On the other hand, the thickness T2 of the thermal conductive sheet 4 interposed between the first surface 20 of the heat generator 2 and the second surface 30 of the heat dissipator 3 is 100 μm as shown in FIG. 3. The thermal conductive sheet 4 has compressibility in the thickness direction 40. That is to say, the thickness T2 of the thermal conductive sheet 4 to which pressure is applied in the thickness direction 40 is smaller than the thickness T1 of the thermal conductive sheet 4 to which no pressure is applied in the thickness direction 40 as shown in FIG. 4A. The compression ratio ((T1−T3)/T1) of a thickness T3 of the thermal conductive sheet 4, to which a pressure of 500 kPa is applied in the thickness direction 40, to the thickness T1 of the thermal conductive sheet 4, to which no pressure is applied in the thickness direction 40, is preferably equal to or greater than 0.15.

The thermal conductivity of the thermal conductive sheet 4 in the thickness direction 40 is 20.5 (W/m·K) in the first embodiment.

Thermal Conductive Fluid

As shown in FIG. 3, the thermal conductive fluid 5 is interposed between the first surface 20 of the heat generator 2 and the second surface 30 of the heat dissipator 3. More specifically, the thermal conductive fluid 5 is held between the first region 21 of the heat generator 2 and the first region 31 of the heat dissipator 3 and is in contact with the first region 21 and the first region 31. The thermal conductive fluid 5 transfers heat from the first surface 20 of the heat generator 2 to the second surface 30 of the heat dissipator 3.

The thermal conductive fluid 5 is made of a substance that turns into liquid or paste at an operating temperature. The operating temperature depends on the temperature that the heat generator 2 can reach and is about 100° C. to about 150° C. according to the first embodiment. In the first embodiment, the thermal conductive fluid 5 is a so-called "heat-dissipating grease" (also called "heat transfer grease" or "heat conduction grease") which includes, for example, silicone oil as its base oil and to which a metallic powder with a high thermal conductivity is added. Note that the thermal conductive fluid 5 does not have to turn into liquid or paste in a temperature environment falling outside of the operating temperature range.

The thermal conductive fluid 5 (heat-dissipating grease) has a thermal conductivity of 0.5 (W/m·K) in the first embodiment. Also, the thermal conductive fluid 5 is solid at a temperature lower than approximately 40° C. but turns into liquid and exhibits flowability at a temperature equal to or higher than approximately 40° C.

Assembling of Electrical Device

When the electrical device 1 is assembled, first, the thermal conductive fluid 5 is placed in the first region 31 of the heat dissipator 3 as shown in FIG. 1. In the first embodiment, the thermal conductive fluid 5 is a heat-dissipating grease in a paste form at the time of assembly. Thus, the heat-dissipating grease is applied onto the first region 31 of the second surface 30 with the second surface 30 of the heat dissipator 3 facing upward.

Next, the thermal conductive sheet 4 is disposed on the second region 32 of the heat dissipator 3 to make the thermal conductive sheet 4 surround the thermal conductive fluid 5 placed in the first region 31.

Next, the heat generator 2 is laid on top of the thermal conductive sheet 4 and the thermal conductive fluid 5 and the heat generator 2 and the heat dissipator 3 are fastened with each other with fastening members (not shown). In the first embodiment, the fastening members are fixing members such as screws and bolts. The fastening members are inserted to penetrate through the heat generator 2 and the thermal conductive sheet 4 and pass from the first surface 20 toward the second surface 30. The heat generator 2 has fixing holes 23, each of which penetrates through the heat generator 2 in the facing direction 10. In addition, the second surface 30 of the heat dissipator 3 has fixing holes 33 which are arranged to overlap with the fixing holes 23 when viewed in the facing direction 10. The thermal conductive sheet 4 has insert vacancies 43 which are arranged to overlap with the fixing holes 23, 33 when viewed in the facing direction 10 and through which the fastening members are inserted and passed. The fixing holes 33 are screw holes into which the fastening members are screwed. On the other hand, the fixing holes 23 and the insert vacancies 43 are annular through holes with no threads.

In the first embodiment, the fixing holes 23, 33 and the insert vacancies 43 are provided at respective positions corresponding to the four corner portions of the rectangular thermal conductive sheet 4 when viewed in the facing direction 10. The fixing holes 23, 33 into which the fastening members are inserted are located in respective parts, other than the first regions 21, 31, of the counter regions. Specifically, the fixing holes 23, 33 into which the fastening members are inserted are located in the second regions 22, 32, respectively. If the fixing holes 23, 33 were provided at respective positions corresponding to the first regions 21, 31, the thermal conductive fluid 5 could flow out of the first regions 21, 31 through the gap between the inner surface of the fixing holes 23, 33 and the surface of the fastening members. The first embodiment may prevent the thermal conductive fluid 5 from flowing out in this manner.

This makes it easier to exhaust, through the gaps between the graphite layers 41, any bubbles present in the thermal conductive fluid 5 sandwiched between the first surface 20 and the second surface 30, thus reducing the chances of the bubble being left in the thermal conductive fluid 5. Also, the thermal conductive sheet 4 may be impregnated with a part of the thermal conductive fluid 5. In that case, the thermal conductive sheet 4 and the thermal conductive fluid 5 impregnated into the thermal conductive sheet 4 are present in the space between the second region 22 and the second region 32.

With the thermal conductive sheet 4 and the thermal conductive fluid 5 sandwiched between the first surface 20 and the second surface 30, the fastening members are inserted into, and passed through, the fixing holes 23 and the insert vacancies 43 and screwed into the fixing holes 33, thereby fastening the heat generator 2 and the heat dissipator 3 with each other. In this manner, the electrical device 1 is assembled completely.

Advantages

When heat is transferred from the first surface 20 of the heat generator 2 to the second surface 30 of the heat dissipator 3, the lower the thermal resistance of the interposed members (namely, the thermal conductive sheet 4 and the thermal conductive fluid 5) is, the higher the heat conduction performance is.

The thermal conductive fluid 5 has a thermal conductivity of about 0.5 (W/m·K) in itself. However, the thermal conductive fluid 5 has flowability. Thus, when the thermal conductive fluid 5 is used by itself, the thermal resistance may be lowered easily by decreasing the thickness of the thermal conductive fluid 5 interposed between the first surface 20 and the second surface 30 to as small a value as less than a few µm or less than 1 µm. Nevertheless, if the thermal conductive fluid 5 is interposed by itself between the first surface 20 and the second surface 30, the chances of the thermal conductive fluid 5 flowing out increases with the passage of time, particularly, as the heat generator 2 generates heat and stops generating heat to be cooled an increasing number of times.

On the other hand, the thermal conductive sheet 4 has as high a thermal conductivity as about 20 (W/m·K) in itself. However, the thermal conductive sheet 4 has no flowability. Thus, the thermal conductive sheet 4 interposed between the first surface 20 and the second surface 30 has a thickness of about 100 µm, thus making it difficult to lower the thermal resistance. Furthermore, the thermal conductive sheet 4 has no flowability, and therefore, the degree of adhesion between the sheet surface and the heat transfer surface, i.e., the adhesion between the sheet surface and the first surface 20 or the second surface 30, is low, which makes it difficult to lower the thermal resistance from this viewpoint as well.

Thus, according to the present disclosure, the second regions 22, 32 are arranged adjacent to the first regions 21, 31, respectively, thus making the thermal conductive sheet 4 received in the second regions 22, 32 prevent the thermal conductive fluid 5 held in the first regions 21, 31 from moving. That is to say, this reduces the chances of the thermal conductive fluid 5 flowing out. Consequently, this configuration contributes to improving the performance of heat conduction between the heat generator 2 and the heat dissipator 3 and reducing the chances of causing a decline in the heat conduction performance, compared to a situation where only the thermal conductive sheet 4 is provided there.

In addition, the thermal conductive sheet 4 has compressibility. This enables lowering the thermal resistance by not only reducing the thickness of the thermal conductive sheet 4 when the thermal conductive sheet 4 is interposed between the first surface 20 and the second surface 30 but also increasing the degree of adhesion between the sheet surfaces and the first surface 20 and the second surface 30. In particular, the compression ratio $((T1-T3)/T1)$ of the thermal conductive sheet 4, to which a pressure of 500 kPa is applied in the thickness direction, is equal to or greater than 0.15. This allows the thermal conductive sheet 4 to be efficiently compressed in the thickness direction 40 with the fastening force applied by the fastening members that fasten the heat generator 2 and the heat dissipator 3 together.

Furthermore, forming the thermal conductive sheet 4 as a graphite sheet makes it easier, when the thermal conductive fluid 5 is sandwiched between the first surface 20 and the second surface 30, to exhaust bubbles out of the thermal conductive fluid 5 through the gap between the graphite layers 41, thus reducing the chances of the bubble being left in the thermal conductive fluid 5. This makes it easier to ensure sufficient heat conduction performance for the thermal conductive fluid 5.

Besides, the second regions 22, 32 are adjacent to the first regions 21, 31, respectively, along the entire circumference thereof and the thermal conductive sheet 4 is formed in an annular shape. This enables significantly reducing the chances of the thermal conductive fluid 5 held in the first regions 21, 31 flowing out.

Moreover, the thermal conductive sheet 4 has the insert vacancies 43 through which the fastening members are inserted and passed, thus making it easier to insert, with reliability, the thermal conductive sheet 4 into the gap between the heat generator 2 and the heat dissipator 3 to be fastened together.

Performance Tests

The present inventors carried out performance tests on the electrical device 1 in terms of its heat conduction performance and its ability to prevent the thermal conductive fluid from flowing out while changing various factors and elements of the thermal conductive sheet 4 as parameters.

The performance tests included nine tests, namely, Test No. 1 through Test No. 9.

In Tests Nos. 1-9, the same heat-dissipating grease as the one described for the first embodiment was used as the thermal conductive fluid 5.

Test No. 1 was carried out with no thermal conductive sheet 4 used for the purpose of comparison. Tests Nos. 2-9 were carried out with a thermal conductive sheet 4 having a longitudinal dimension L1 of 120 mm and a lateral dimension L2 of 60 mm sandwiched between the first surface 20 and the second surface 30 with a predetermined pressure applied thereto.

The material for the thermal conductive sheet 4 was a graphite sheet in Tests Nos. 2-7 as in the first embodiment and silicone rubber in Tests Nos. 8 and 9. The silicone rubber had a thermal conductivity of about 0.5 (W/m·K).

The width W1 of the thermal conductive sheet 4 was 2 mm in Test No. 2; 5 mm in Test No. 3; 10 mm in Test No. 4; 5 mm in Test No. 5; and 10 mm in Tests Nos. 6-9.

The thickness T1 of the thermal conductive sheet 4 was 200 mm in Tests Nos. 2-6; 70 mm in Test No. 7; 50 mm in Test No. 8; and 100 mm in Test No. 9.

The temperature at a predetermined point inside the heat generator 2 was measured by repeatedly causing the heat generator 2 of the electrical device 1 to generate heat and stop generating heat to be cooled. The temperature after the heat generator 2 had been repeatedly caused to generate heat and stop generating heat to be cooled in 100 cycles and the temperature after the heat generator 2 had been repeatedly caused to generate heat and stop generating heat to be cooled in 500 cycles were measured to see if the thermal conductive fluid 5 flowed out. In this manner, the electrical device 1 was evaluated in terms of its heat conduction performance and its ability to prevent the thermal conductive fluid 5 from flowing out.

As for the heat conduction performance, the electrical device 1 was evaluated as follows as indicated in the "heat conduction" column in the following Table 1:

○(corresponding to Grade A): if the electrical device 1 exhibited good performance;

Δ(corresponding to Grade B): if the electrical device 1 exhibited fair performance; or x (corresponding to Grade C): if the performance of the electrical device 1 deteriorated significantly with the passage of time.

As for the ability to prevent the thermal conductive fluid 5 from flowing out, the electrical device 1 was evaluated as follows as indicated in the "outflow prevention ability" column in the following Table 1:

○(corresponding to Grade A): if the outflow could be prevented;

Δ(corresponding to Grade B): if the outflow was observed after the electrical device 1 had gone through a great many cycles; or x (corresponding to Grade C): if the outflow was observed after the electrical device 1 had gone through a small number of cycles.

The results of these performance tests are summarized in the following Table 1:

TABLE 1

| Test No. | Material | Width W1 (mm) | Thickness T1 (μm) | After 100 cycles (° C.) | After 500 cycles (° C.) | Heat conduction | Outflow prevention |
|---|---|---|---|---|---|---|---|
| 1 | — | — | — | 103 | 123 | x | x |
| 2 | Graphite sheet | 2 | 200 | 101 | 111 | ○ | Δ |
| 3 | Graphite sheet | 5 | 200 | 108 | 102 | ○ | ○ |
| 4 | Graphite sheet | 10 | 200 | 125 | 112 | Δ | ○ |
| 5 | Graphite sheet | 5 | 200 | 104 | 106 | ○ | Δ |
| 6 | Graphite sheet | 10 | 200 | 109 | 104 | ○ | ○ |
| 7 | Graphite sheet | 10 | 70 | 107 | 105 | ○ | Δ |
| 8 | Silicone rubber | 10 | 50 | 113 | 120 | ○ | Δ |
| 9 | Silicone rubber | 10 | 100 | 138 | 139 | Δ | ○ |

The outflow of the thermal conductive fluid 5 would be prevented particularly effectively if the thermal conductive sheet 4 has a width W1 equal to or greater than 5 mm.

In Test No. 4 in which the width W1 was 10 mm, the resultant heat conduction performance was inferior to Test No. 3 in which the width W1 was 5 mm. This result was obtained in Test No. 4 probably because it would have been too difficult to compress, in the facing direction 10, the thermal conductive sheet 4 with a width W1 of 10 mm because of its large width W1 to decrease the thermal resistance.

Also, the ratio of the area of the second region 22, 32 to the sum of the respective areas of the first region 21, 31 and the second region 22, 32 is preferably equal to or greater than 0.03 and equal to or less than 0.7.

According to the present disclosure, to achieve good heat conduction performance and good outflow prevention ability, the width W1 preferably falls within the range from 1 mm to 20 mm That is to say, the smaller the width W1 is, the more significantly the outflow prevention ability deteriorates. On the other hand, the larger the width W1 is, the more difficult it is to compress the thermal conductive sheet 4 in the thickness direction 40 and decrease the thermal resistance. That is why there should be such optimum values.

Second Embodiment

Next, an electrical device 1 according to a second embodiment will be described with reference to FIG. 5. The electrical device 1 according to the second embodiment is mostly the same as the electrical device 1 according to the first embodiment described above. Thus, description of their common features will be omitted herein to avoid redundancy.

In the first embodiment described above, the thermal conductive sheet 4 has a single window 42. On the other hand, in the second embodiment, the thermal conductive sheet 4 has two windows 42.

The thermal conductive sheet 4 includes a beam 44 which is provided at the middle of two longer sides thereof to bridge these two longer sides. This beam 44 divides the inside of the thermal conductive sheet 4 into the two windows 42.

Also, the respective parts, facing the thermal conductive sheet 4, of the first surface 20 and the second surface 30 are the second regions 22, 32. The respective parts, facing these two windows 42, of the first surface 20 and the second surface 30 are the first regions 21, 31. That is to say, the counter region of each of the first surface 20 and the second surface 30 includes a plurality of first regions 21 or 31 divided by the second region 22, 32.

This requires, even if the first surface 20 of the heat generator 2 has two heat generating regions or if there are two heat generators 2, inserting only one thermal conductive sheet 4. In addition, providing the beam 44 increases the mechanical strength and the rigidity of the thermal conductive sheet 4 (in particular, the rigidity of the thermal conductive sheet 4 in the thickness direction 40). This makes it easier to provide a sufficient space between the first surface 20 of the heat generator 2 and the second surface 30 of the heat dissipator 3, thus reducing the chances of the thermal conductive fluid 5 being pushed by the first surface 20 and the second surface 30 to leak out of the space.

Third Embodiment

Next, an electrical device 1 according to a third embodiment will be described with reference to FIG. 6. The electrical device 1 according to the third embodiment is mostly the same as the electrical device 1 according to the second embodiment described above. Thus, description of their common features will be omitted herein to avoid redundancy.

In the second embodiment described above, the thermal conductive sheet 4 has two windows 42. On the other hand, in the third embodiment, the thermal conductive sheet 4 has four windows 42.

The thermal conductive sheet 4 includes, as the beams 44, not only a beam 441 provided at the middle of the two longer sides thereof to bridge these two longer sides but also another beam 442 provided at the middle of the two shorter sides thereof to bridge these two shorter sides. These two beams 441, 442 divide the inside of the thermal conductive sheet 4 into four windows 42.

Also, the respective parts, facing the thermal conductive sheet 4, of the first surface 20 and the second surface 30 are the second regions 22, 32. The respective parts, facing these four windows 42, of the first surface 20 and the second surface 30 are the first regions 21, 31.

This requires, even if the first surface 20 of the heat generator 2 has four heat generating regions or if there are four heat generators 2, inserting only one thermal conductive sheet 4. In addition, providing the beams 441, 442 increases the mechanical strength and the rigidity of the thermal conductive sheet 4 (in particular, the rigidity of the thermal conductive sheet 4 in the thickness direction 40). This makes it easier to provide a sufficient space between the first surface 20 of the heat generator 2 and the second surface 30 of the heat dissipator 3, thus reducing the chances of the thermal conductive fluid 5 being pushed by the first surface 20 and the second surface 30 to leak out of the space.

Fourth Embodiment

Next, an electrical device 1 according to a fourth embodiment will be described with reference to FIG. 7. The electrical device 1 according to the fourth embodiment is mostly the same as the electrical device 1 according to the third embodiment described above. Thus, description of their common features will be omitted herein to avoid redundancy.

In the third embodiment described above, the thermal conductive sheet 4 includes the beams 441, 442 that bridge the pair of longer sides thereof and the pair of shorter sides thereof, respectively. On the other hand, according to the fourth embodiment, the thermal conductive sheet 4 also has four windows 42 but includes different beams 44.

The thermal conductive sheet 4 includes, as the beams 44, a beam 443 bridging one pair of corners thereof that face each other diagonally and another beam 444 bridging the other pair of corners thereof that face each other diagonally. These two beams 443, 444 divide the inside of the thermal conductive sheet 4 into four windows 42. This allows the thermal conductive sheet 4 according to the fourth embodiment to deal with the situations described for the third embodiment in the same way, even though the thermal conductive sheet 4 according to the fourth embodiment has a different shape from its counterpart of the third embodiment. In addition, providing the beams 443, 444 increases the mechanical strength and the rigidity of the thermal conductive sheet 4 (in particular, the rigidity of the thermal conductive sheet 4 in the thickness direction 40). This makes it easier to provide a sufficient space between the first surface 20 of the heat generator 2 and the second surface 30 of the heat dissipator 3, thus reducing the chances of the thermal conductive fluid 5 being pushed by the first surface 20 and the second surface 30 to leak out of the space.

Fifth Embodiment

Figure 8:
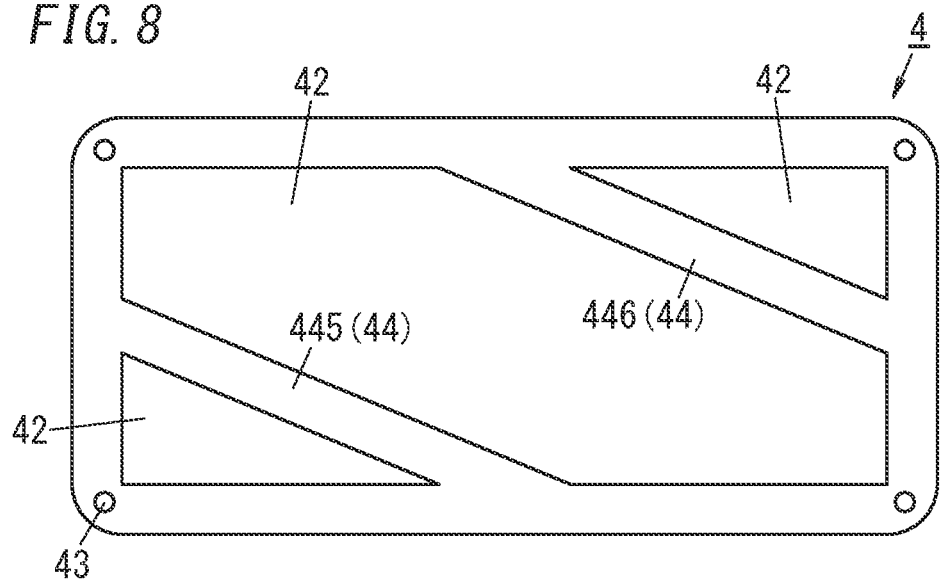
FIG. 8 is a top view of a thermal conductive sheet according to a fifth embodiment as viewed in the thickness direction.

Next, an electrical device 1 according to a fifth embodiment will be described with reference to FIG. 8. The electrical device 1 according to the fifth embodiment is mostly the same as the electrical device 1 according to the fourth embodiment described above. Thus, description of their common features will be omitted herein to avoid redundancy.

The thermal conductive sheet 4 includes, as the beams 44, a beam 445 bridging the middle of one longer side thereof and the middle of one short side thereof and a beam 446 bridging the middle of the other longer side thereof and the middle of the other short side thereof. These two beams 445, 446 divide the inside of the thermal conductive sheet 4 into three windows 42. This allows the thermal conductive sheet 4 according to the fifth embodiment to deal with the situations described for the third and fourth embodiments in the same way, even though the thermal conductive sheet 4 according to the fifth embodiment has a different shape from its counterparts of the third and fourth embodiments. In addition, providing the beams 445, 446 increases the mechanical strength and the rigidity of the thermal conductive sheet 4 (in particular, the rigidity of the thermal conductive sheet 4 in the thickness direction 40). This makes it easier to provide a sufficient space between the first surface 20 of the heat generator 2 and the second surface 30 of the heat dissipator 3, thus reducing the chances of the thermal conductive fluid 5 being pushed by the first surface 20 and the second surface 30 to leak out of the space.

Sixth Embodiment

Figure 9:
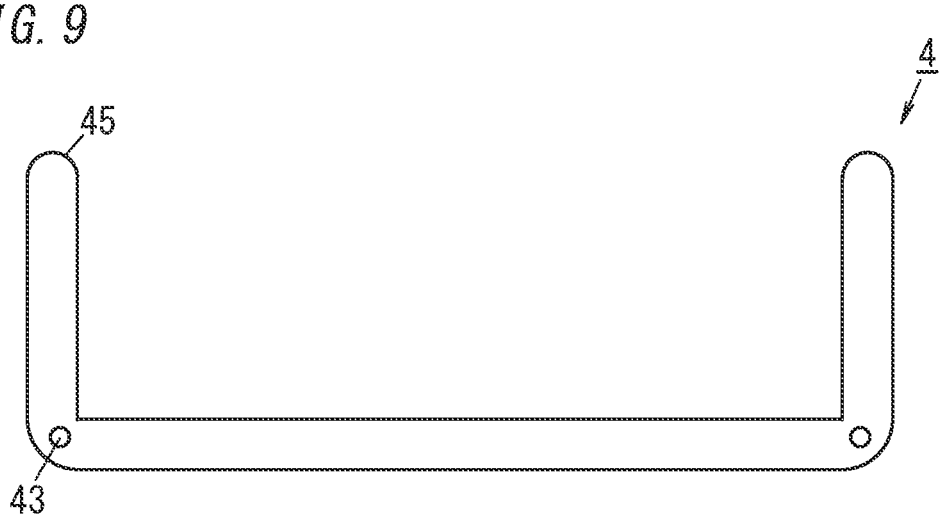
FIG. 9 is a top view of a thermal conductive sheet according to a sixth embodiment as viewed in the thickness direction.

Next, an electrical device 1 according to a sixth embodiment will be described with reference to FIG. 9. The electrical device 1 according to the sixth embodiment is mostly the same as the electrical device 1 according to any of the first through fifth embodiments described above. Thus, description of their common features will be omitted herein to avoid redundancy.

In the first through fifth embodiments described above, the thermal conductive sheet 4 is formed in an annular shape and the second regions 22, 32 are adjacent to the first regions 21, 31 along the entire circumference thereof. On the other hand, in the sixth embodiment, the thermal conductive sheet 4 is formed in the shape of a C- or U-frame having a window 45 opened in one direction and the second region 22, 32 is adjacent to the first region 21, 31 along only a part of the circumference thereof. The thermal conductive sheet 4 is used with its window 45 facing upward. The thermal conductive fluid 5 is held in an internal region surrounded with inner surfaces of the frame-shaped thermal conductive sheet 4.

If the first surface 20 and the second surface 30 are aligned with the upward/downward direction, a part, provided over the thermal conductive fluid 5, of the thermal conductive sheet 4 is unnecessary because the part does not contribute to preventing the thermal conductive fluid 5 from flowing out. This contributes to not only cutting down the material used to make the thermal conductive sheet 4 but also reducing the arrangement space sufficiently to facilitate downsizing.

Variations

Next, variations of the exemplary embodiments described above will be enumerated one after another. Note that the variations to be described below may be adopted in combination as appropriate.

The electrical device 1 does not have to be used in a power converter unit.

The heat generator 2 does not have to be a power module, a reactor, or a transformer. The heat generator 2 does not have to include a board, a conductor, and a mounted component to be mounted on the board.

The first surface 20 of the heat generator 2 does not have to be a flat surface but may also be a curved surface, for example. Also, any member may be used without limitation to form the first surface 20 of the heat generator 2. In addition, the material for this member is not limited to any particular material, either.

The heat dissipator 3 does not have to include the fins 301. The heat dissipator 3 may further include, for example, a Peltier element and/or a cooling device such as a water cooler.

Although any of various metals and alloys is suitably used as a material for the heat dissipator 3, the material for the heat dissipator 3 does not have to be a metal or an alloy.

The second surface 30 of the heat dissipator 3 does not have to be a flat surface but may also be a curved surface, for example.

The graphite sheet serving as the thermal conductive sheet 4 does not have to be made up of a plurality of graphite layers 41 which are stacked one on top of another in the thickness direction 40. Also, the thermal conductive sheet 4 is preferably, but does not have to be, a graphite sheet. Rather, the material for the thermal conductive sheet 4 is not limited to any particular one, as long as the material has a larger thermal conductivity than silicone rubber.

The longitudinal dimension L1, lateral dimension L2, and width W1 of the thermal conductive sheet 4 are not limited to any particular values. The width W1 of the thermal conductive sheet 4 is preferably equal to or greater than 5 mm. Also, the width W1 of vertically extending parts of the thermal conductive sheet 4 and the width W1 of horizontally extending parts of the thermal conductive sheet 4 may be the same as each other or different from each other, whichever is appropriate. The width W1 of the thermal conductive sheet 4 may be constant or vary from one part to another, whichever is appropriate.

The shape and dimensions of the thermal conductive sheet 4 as viewed in the thickness direction 40 are not limited to any particular ones.

The thickness (T1) of the thermal conductive sheet 4 in a non-compressed state and the thickness (T2) of the thermal conductive sheet 4 assembled into the electrical device 1 (i.e., in a compressed state) are not limited to any particular values. Also, the compression ratio ((T1−T3)/T1) of the thermal conductive sheet 4, to which a pressure of 500 kPa is applied in the thickness direction, as measured in the thickness direction 40, does not have to be equal to or greater than 0.15. In addition, the thermal conductive sheet 4 does not have to have compressibility in the thickness direction 40, either.

The thermal conductivity of the thermal conductive sheet 4 as measured in the thickness direction 40 does not have to be 20.5 (W/m·K) but is preferably equal to or greater than 5 (W/m K) and is more preferably equal to or greater than 10 (W/m·K). In other words, the thermal conductivity of the thermal conductive sheet 4 as measured in the thickness direction 40 is preferably as high as possible. Meanwhile, the thermal conductivity of the thermal conductive sheet 4 as measured in the sheet surface direction may be different from, or the same as, the thermal conductivity thereof as measured in the thickness direction 40.

The operating temperature does not have to fall within the range from 100° C. to 150° C.

The thermal conductive fluid 5 does not have to be the heat-dissipating grease but may also be a liquid metal such as mercury which turns into liquid or paste at the operating temperature thereof or may even be a so-called "phase change material (PCM)." That is to say, any suitable material may be used as the thermal conductive fluid 5 without limitation.

The thermal conductivity of the thermal conductive fluid 5 does not have to be 0.5 (W/m·K) but is preferably equal to or greater than 1 (W/m·K). In other words, the thermal conductivity of the thermal conductive fluid 5 is preferably as high as possible.

The thermal conductive fluid 5 does not have to be placed in the first region 31 with the second surface 30 of the heat dissipator 3 facing upward. Alternatively, the thermal conductive fluid 5 may also be placed in the first region 21 with the first surface 20 of the heat generator 2 facing upward.

The thermal conductive fluid 5 may be placed in either the heat generator 2 or the heat dissipator 3 after the thermal conductive sheet 4 has been disposed on either the heat generator 2 or the heat dissipator 3. Alternatively, both the thermal conductive sheet 4 and the thermal conductive fluid 5 may be arranged simultaneously on either the heat generator 2 or the heat dissipator 3.

In the first embodiment described above, the fixing holes 33 are screw holes and the fastening members are screwed into the heat dissipator 3. Alternatively, the heat generator 2 and the heat dissipator 3 may be fastened with each other by screwing the fastening members into the heat generator 2. Furthermore, the heat generator 2 and the heat dissipator 3 do not have to be fixed to each other by fastening.

The insert vacancies 43 may also be grooves (or cutouts) opened on the outer peripheral edges of the thermal conductive sheet 4.

The positions, numbers, and other parameters of the fixing holes 23, 33 and the insert vacancies 43 are not limited to any particular ones.

Optionally, in any of the embodiments and variations described above, part or all of the thermal conductive sheet 4 may be impregnated with the thermal conductive fluid 5.

This increases the degree of adhesion between the thermal conductive sheet 4 and the first surface 20 or the second surface 30.

(Recapitulation)

As can be seen from the foregoing description, an electrical device (1) according to a first aspect includes a heat generator (2), a heat dissipator (3), a thermal conductive sheet (4), and a thermal conductive fluid (5). The heat generator (2) has a first surface (20). The heat dissipator (3) has a second surface (30) that faces the first surface (20). The thermal conductive sheet (4) and the thermal conductive fluid (5) are both interposed between the first surface (20) and the second surface (30). The first surface (20) and the second surface (30) face each other in their respective counter regions. Each of the counter regions includes a first region (21, 31) and a second region (22, 32) when viewed in a direction in which the first and second surfaces (20, 30) face each other. The first region (21, 31) holds the thermal conductive fluid (5) but does not receive the thermal conductive sheet (4). The second region (22, 32) is adjacent to the first region (21, 31) and receives the thermal conductive sheet (4).

According to the first aspect, the thermal conductive fluid (5) held in the first region (21, 31) is prevented from moving by the thermal conductive sheet (4) received in the second region (22, 32), thus reducing the chances of the thermal conductive fluid (5) flowing out. This reduces the chances of causing a decline in the performance of heat conduction between the heat generator (2) and the heat dissipator (3).

A second aspect may be implemented in conjunction with the first aspect. In the second aspect, each of the counter regions includes a plurality of the first regions (21, 31) divided from each other by the second region (22, 32).

The second aspect requires placing only one thermal conductive sheet (4) even if the first surface (20) of the heat generator (2) has a plurality of heat generating regions or even if a plurality of heat generators (2) are provided.

A third aspect may be implemented in conjunction with the first or second aspect. In the third aspect, a ratio of an area of the second region (22, 32) to a sum of respective areas of the first and second regions (21, 31; 22, 32) is equal to or greater than 0.03 and equal to or less than 0.7.

The third aspect makes it easier to prevent the thermal conductive fluid (5) from flowing out while improving the heat conduction performance.

A fourth aspect may be implemented in conjunction with any one of the first to third aspects. In the fourth aspect, the second region (22, 32) has a dimension equal to or greater than 5 mm as measured in a direction pointing away from the first region (21, 31).

The fourth aspect makes it easier to achieve the advantage of preventing the thermal conductive fluid (5) from flowing out.

A fifth aspect may be implemented in conjunction with any one of the first to fourth aspects. In the fifth aspect, a thickness of the thermal conductive sheet (4) interposed between the first and second surfaces (20, 30) is smaller than a thickness of the thermal conductive sheet (4) to which no pressure is applied in a thickness direction (40).

The fifth aspect makes it easier to lower the thermal resistance by not only reducing the thickness of the thermal conductive sheet (4) interposed between the first surface (20) and the second surface (30) but also increasing the adhesion between the sheet surface and the first surface (20) and the second surface (30).

A sixth aspect may be implemented in conjunction with the fifth aspect. In the sixth aspect, a compression ratio of a thickness of the thermal conductive sheet (4), to which a pressure of 500 kPa is applied in the thickness direction (40), to the thickness of the thermal conductive sheet (4), to which no pressure is applied in the thickness direction (40), is equal to or greater than 0.15.

The sixth aspect enables efficiently compressing the thermal conductive sheet (4) in the thickness direction (40) with the fastening force applied by fastening members for fastening the heat generator (2) and the heat dissipator (3) together.

A seventh aspect may be implemented in conjunction with any one of the first to sixth aspects. In the seventh aspect, the thermal conductive sheet (4) is a graphite sheet formed by stacking a plurality of graphite layers (41) one on top of another in a thickness direction (40).

The seventh aspect makes it easier to ensure sufficient heat conduction performance for the thermal conductive fluid (5).

An eighth aspect may be implemented in conjunction with any one of the first to seventh aspects. In the eighth aspect, part or all of the thermal conductive sheet (4) is impregnated with the thermal conductive fluid (5).

The eighth aspect increases the adhesion of the thermal conductive sheet (4) to the first surface (20) or the second surface (30).

A ninth aspect may be implemented in conjunction with any one of the first to eighth aspects. In the ninth aspect, the heat generator (2) and the heat dissipator (3) are fastened to each other with a fastening member inserted to pass from the first surface (20) toward the second surface (30). The fastening member is provided in a part, excluding the first region (21, 31), of each of the counter regions.

If a fixing hole (23, 33) is provided at a position corresponding to the first region (21, 31), the thermal conductive fluid (5) could flow out of the first region (21, 31) through the gap between the inner surface of the fixing hole (23, 33) and the surface of the fastening member. The ninth aspect enables preventing the thermal conductive fluid (5) from flowing out in this manner.

A tenth aspect may be implemented in conjunction with the ninth aspect. In the tenth aspect, the fastening member is provided in the second region (22, 32). The thermal conductive sheet (4) includes an insert vacancy (43) into which the fastening member is inserted.

The tenth aspect enables inserting the thermal conductive sheet (4) easily and with reliability into the gap between the heat generator (2) and the heat dissipator (3) to be fastened together.

An eleventh aspect may be implemented in conjunction with the tenth aspect. In the eleventh aspect, the insert vacancy (43) is an annular hole or cutout.

The eleventh aspect enables forming the insert vacancy (43) easily.

A twelfth aspect may be implemented in conjunction with any one of the first to eleventh aspects. In the twelfth aspect, the second region (22, 32) is adjacent to the first region (21, 31) along an entire circumference of the first region (21, 31). The thermal conductive sheet (4) has an annular shape.

The twelfth aspect may significantly reduce the chances of the thermal conductive fluid (5) held in the first region (21, 31) flowing out.

A thirteenth aspect may be implemented in conjunction with any one of the first to eleventh aspects. In the thirteenth aspect, the second region (22, 32) is adjacent to the first region (21, 31) along a part of a circumference thereof. The thermal conductive sheet (4) is formed in a shape of a frame having a window (45) opened in one direction.

According to the thirteenth aspect, the thermal conductive sheet (4) does not have to surround the first region (21, 31) along the entire circumference thereof, thus contributing to cutting down the material to be used for the thermal conductive sheet (4). In addition, the thirteenth aspect also contributes to downsizing by reducing the arrangement space.

A fourteenth aspect may be implemented in conjunction with the thirteenth aspect. In the fourteenth aspect, the thermal conductive sheet (4) is used with the window (45) facing upward.

The fourteenth aspect contributes to not only cutting down the material to be used for the thermal conductive sheet (4) but also downsizing by reducing the arrangement space.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. An electrical device comprising:
a heat generator having a first surface;
a heat dissipator having a second surface facing the first surface; and
a thermal conductive sheet and a thermal conductive fluid, the thermal conductive sheet and the thermal conductive fluid being both interposed between the first surface and the second surface,
the first surface and the second surface facing each other in their respective counter regions, each of the counter regions including a first region and a second region when viewed in a direction in which the first surface and the second surface face each other,
the first region holding the thermal conductive fluid but not receiving the thermal conductive sheet, and
the second region being adjacent to the first region and receiving the thermal conductive sheet, wherein
a thickness of the thermal conductive sheet interposed between first surface and the second surface is smaller than a thickness of the thermal conductive sheet to which no pressure is applied in a thickness direction,
a compression ratio of a thickness of the thermal conductive sheet, to which a pressure of 500 kPa is applied in the thickness direction, to the thickness of the thermal conductive sheet, to which no pressure is applied in the thickness direction, is equal to or greater than 0.15.

2. An electrical device comprising:
a heat generator having a first surface;
a heat dissipator having a second surface facing the first surface; and
a thermal conductive sheet and a thermal conductive fluid, the thermal conductive sheet and the thermal conductive fluid being both interposed between the first surface and the second surface,
the first surface and the second surface facing each other in their respective counter regions, each of the counter regions including a first region and a second region when viewed in a direction in which the first surface and the second surface face each other,
the first region holding the thermal conductive fluid but not receiving the thermal conductive sheet, and
the second region being adjacent to the first region and receiving the thermal conductive sheet, wherein
the thermal conductive sheet is a graphite sheet formed by stacking a plurality of graphite layers one on top of another in a thickness direction.

3. An electrical device comprising:
a heat generator having a first surface;
a heat dissipator having a second surface facing the first surface; and
a thermal conductive sheet and a thermal conductive fluid, the thermal conductive sheet and the thermal conductive fluid being both interposed between the first surface and the second surface,
the first surface and the second surface facing each other in their respective counter regions, each of the counter regions including a first region and a second region when viewed in a direction in which the first surface and the second surface face each other,
the first region holding the thermal conductive fluid but not receiving the thermal conductive sheet, and
the second region being adjacent to the first region and receiving the thermal conductive sheet, wherein
part or all of the thermal conductive sheet is impregnated with the thermal conductive fluid.

* * * * *